United States Patent [19]

Mattausch

[11] Patent Number: 4,691,302
[45] Date of Patent: Sep. 1, 1987

[54] CIRCUIT ARRANGEMENT COMPRISING A MATRIX-SHAPED MEMORY ARRANGEMENT FOR VARIABLY ADJUSTABLE DELAY OF DIGITAL SIGNALS

[75] Inventor: Hans J. Mattausch, Kirchheim, Fed. Rep. of Germany

[73] Assignee: Siemens Aktiengesellschaft, Berlin and Munich, Fed. Rep. of Germany

[21] Appl. No.: 890,115

[22] Filed: Jul. 28, 1986

[30] Foreign Application Priority Data

Sep. 4, 1985 [DE] Fed. Rep. of Germany ....... 3531598

[51] Int. Cl.$^4$ ............................................. G11C 8/00
[52] U.S. Cl. ................................. 365/240; 365/194; 365/233
[58] Field of Search ............... 365/189, 194, 190, 230, 365/240, 233

[56] References Cited

U.S. PATENT DOCUMENTS 3,764,813 10/1973 Clement et al. ............... 365/240
4,636,986 1/1987 Pinkham ....................... 365/240

Primary Examiner—James W. Moffitt
Attorney, Agent, or Firm—Hill, Van Santen, Steadman & Simpson

[57] ABSTRACT

A circuit arrangement comprises a matrix-shaped memory for variably adjustable delay of digital signals, whereby trigger elements in the form of two inverters fed back to one another are provided as storage elements, one of the two nodes thereof being connectible to a write bit line by way of a switching transistor controllable from a write word line and the other being connectible to a read bit line via a switching transistor controllable from a read word line. A row selector is clocked by the input data clock and is continuously settable and resettable at any time, the row selector comprising two signal outputs per selection stage which are offset in phase relative to one another, these respectively selecting one of the write word lines or read word lines which are provided per row of the matrix-shaped memory. Two separate bit lines, namely a write bit line and a read bit line are provided per column, these being respectively interconnected to all memory cells of a column. A disconnectible storage amplifier is provided per column, the input thereof being connected to the read bit line of the column assigned thereto and the output thereof being connected to the write bit line of the column following thereafter and serving as a data output. A data input for the data signals to be delayed is connected to the write bit line of the first column.

8 Claims, 9 Drawing Figures

CIRCUIT ARRANGEMENT COMPRISING A MATRIX-SHAPED MEMORY ARRANGEMENT FOR VARIABLY ADJUSTABLE DELAY OF DIGITAL SIGNALS

CROSS REFERENCE TO RELATED APPLICATIONS

This application is related to an U.S. application Ser. No. 828,512 and to an U.S. application Ser. No. 828,513, both filed Feb. 12, 1986, and also to an U.S. application Ser. No. 890,110 filed July 28, 1986.

BACKGROUND OF THE INVENTION

1. Field of the Invention

The present invention relates to a circuit arrangement comprising a matrix-shaped memory arrangement for variably adjustable delay of digital signals, particularly for digital signal processing and communications technology.

2. Description of the Prior Art

Defined delays of digital data streams can be effected as is frequently required in the field of digital signal processing and the field of communications technology by delay apparatus. Defined delays are employed, for example, for the compensation of transit times. Given a constant number of design delay clocks, an arrangement comprising a shift register is generally available as a delay device. When, however, the delay is to be variably adjustable, then certain problems occur given the use of shift registers.

It is also known to delay data streams in defined fashion by way of an arrangement composed of standard circuits and memory modules. In such an arrangement, the component parts of the data stream are deposited with a freely-adjustable memory. This memory is driven by a decoder which is, in turn, driven by one (or more) counters. The duration of the delay is thereby established by the spacing of the counter reset pulses. Since the memory cells of such freely-adjustable memories can only be respectively written or read per clock, the necessity arises of either operating the memories at twice the clock rate or of switching back and forth between two memory units in a multiplex mode. The first solution of this problem has the disadvantage that the maximum data clock frequency can be only half as high as the maximum memory cycle frequency. The solution of the latter problem requires involved logic circuits for address control and a necessary reordering of the data. For an integratable realization of such a circuit arrangement, disadvantages also arise because of the high space requirement of the necessary multiplexers and because of the required, extensive wiring.

German patent application No. P 35 06 603.2, corresponding to the above-referenced U.S. Ser. No. 828,512, discloses a circuit arrangement comprising a matrix-shaped memory for variably adjustable delay of digital signals. This known circuit arrangement comprising a matrix-shaped memory for variably adjustable delay of digital signals essentially contains known three-transistor cells with overlapping write/read cycles as storage elements and comprises a row selector which is clock controlled by an input data clock, continuously steppable and resettable at any time. The row selector comprises two respective signal outputs per selection stage which are offset in phase relative to one another, these respectively selecting a write word line or a read word line. The row selector of this known circuit arrangement is reset with a reset signal preferably derived from the input data clock. The chronological spacing between reset pulses is selected such that it is equal to the required delay time which is to be established between an undelayed data output and the first of m delay data outputs.

SUMMARY OF THE INVENTION

The object of the present invention is to provide a circuit arrangement of the type set forth above by way of which defined, liberally adjustable delays can be achieved, the circuit arrangement being constructed as an integrated circuit arrangement having a low circuit requirement and allowing higher data rates in comparison to that heretofore known. In particular, the object is to provide a circuit arrangement which is particularly suitable for integration in metal-oxide-semiconductor (MOS) technology. The above object is achieved, according to the present invention, in a circuit arrangement comprising a matrix-shaped memory for variably adjustable delay of digital signals which is characterized in that:

trigger circuits in the form of two inverters fed back to one another are provided as storage elements, of which one of the two nodes thereof is connectible to a write bit line via a switching transistor controlled from a write word line and the other of which is connectible to a read bit line by way of a switching transistor controlled from a read word line;

a row selector, clock controlled by the input data clock and continuously steppable and resettable at any time is provided, the row selector comprising two respective signal outputs per selection stage which are offset in phase relative to one another and which respectively select one of the write word lines or read word lines which are provided per row of the matrix;

two separate bit lines, namely, one of the write bit lines and one of the read bit lines are provided per column and are respectively interconnected to all memory cells of a column;

a disconnectible storage amplifier is provided per column, the input thereof being connected to the read bit line of the column assigned thereto and the output thereof being connected to the write bit line of the column following thereafter and serving as a data output assigned thereto;

a data input for the data signals to be delayed is connected to the write bit line of the first column;

a reset input is connected to setting inputs of a first element of the row selector as well as to the reset inputs of the remaining elements of the row selector;

a selection device for selecting columns of the memory is provided and is switchable between two selected neighboring columns and is supplied with one part of an external delay time setting data word for selection of these columns;

a setting and control device is provided, the full external delay time setting data word being supplied thereto, the setting and control device generating a reset signal for the memory and a control signal for the selection device, the setting and control device being supplied with an external reset signal via a reset input to directly reset the setting and control device and to indirectly reset the memory;

the memory comprises a data input for receiving the data signal to be delayed;

the selection device comprises a data output for outputting the delay data signals;

the selection device has data inputs connected to data outputs of the memory; and the setting and control device is a data clock controlled device.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
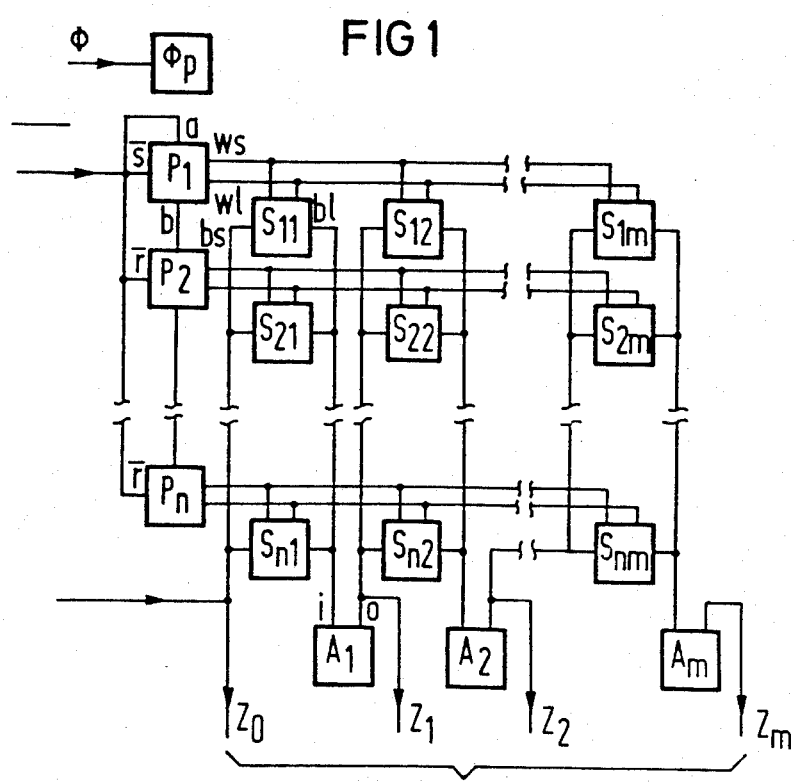
FIG. 1 is a block circuit diagram of the delay arrangement of the aforementioned U.S. application Ser. No. 828,512 in which a row selector, matrix-shaped memory, regenerator circuits and clock control are provided and which may be employed in practicing the present invention.

As set forth above, FIG. 1 shows a known circuit arrangement for variably adjustable delay of digital signals comprising a matrix-shaped memory.

The circuit arrangement illustrated contains a data input D, a reset input $\overline{Reset}$, a data input $\phi$ which synchronizes a clock control $\phi_P$, as well as a plurality of data outputs $Z_0$-$Z_m$. A row selector comprises a plurality of stages $P_1$-$P_n$, wherein the stages are interconnected in series, whereby the first stage $P_1$ has a setting input s and a signal input a and the remaining stages $P_2$-$P_n$ have their respective reset inputs $\bar{r}$ connected to the reset input $\overline{Reset}$, whereby a respective signal output b is connected to the signal input a of the respective following stage, and whereby a respective write word line ws and read word line wl are provided per stage. Known three-transistor memory cells with overlapping write/read cycles are provided as storage elements in the matrix-shaped memory. The continuously steppable row selector $P_1$-$P_n$ which is resettable at any time is clock controlled by an input data clock. Per selection step, namely per stage, it comprises two signal outputs, a write word line ws and a read word line wl, which are offset in phase relative to one another and which are provided per row of the matrix. Two separate bit lines, namely a write bit line bs and a read bit line bl, are provided per column in the memory, these being respectively interconnected to all memory cells of a column. A disconnectible storage amplifier $A_1$-$A_m$ is also provided per column, the input i thereof being respectively connected to the appertaining read bit line bl of the column assigned thereto and the output o thereof being respectively connected to the write bit line bs of the column following thereafter and serving as data outputs $Z_1$-$Z_m$ assigned to the respective amplifiers. The data input d for the data signals to be delayed is connected to the write bit line bs of the first column and to an undelayed output $Z_0$. The further data outputs $Z_1$-$Z_m$ are delayed such in comparison to the undelayed signal output $Z_0$ that the chronological spacing between $\overline{Reset}$ pulses is selected such that it is equal to the required delay time which is to be set between the undelayed data output $Z_0$ and the first delayed data output $Z_1$.

Figure 2:
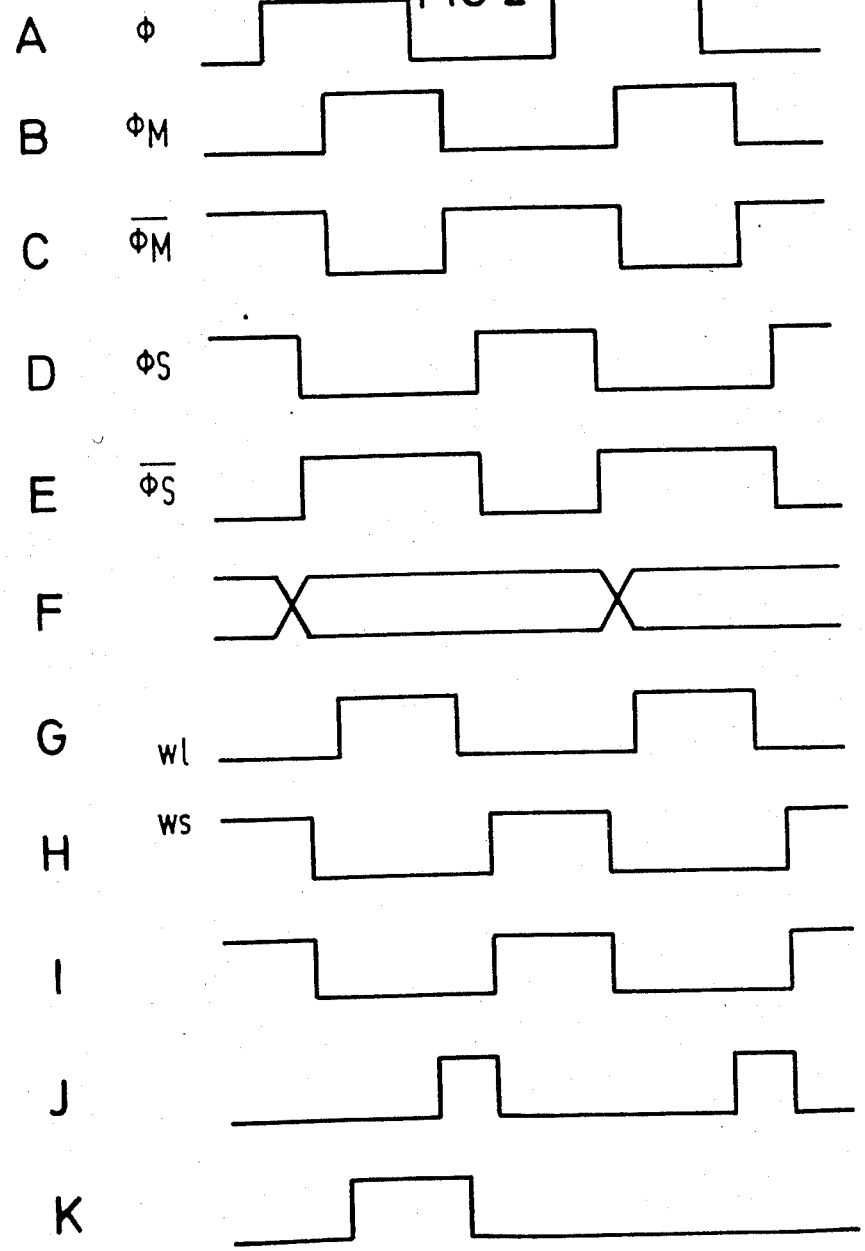
FIG. 2 (A-K) is a pulse/time diagram for explaining the operations of the circuit arrangement of FIG. 1.

As already set forth above, FIG. 2 illustrates a pulse/time diagram for explaining the operation of the circuit arrangement of the present invention.

In FIG. 2, line a shows the basic clock applied to the clock control. Auxiliary clocks derived therefrom for the control of the row selector, namely $\phi_M$, $\phi_{M'}$, $\phi_S$ and $\phi_{S'}$, are shown in lines B, C, D and E, respectively. Line F illustrates the phase relation of the input data stream with respect to the basic clock $\phi$. Lines G and H illustrate the output signals of the row selector, namely the read word line and the write word line. Lines I and J illustrate a precharge signal and, respectively, a hold signal which are employed for controlling the amplifier circuit. Line K, finally, illustrates the phase relation of the required reset signal with respect to the basic clock $\phi$.

Figure 3:
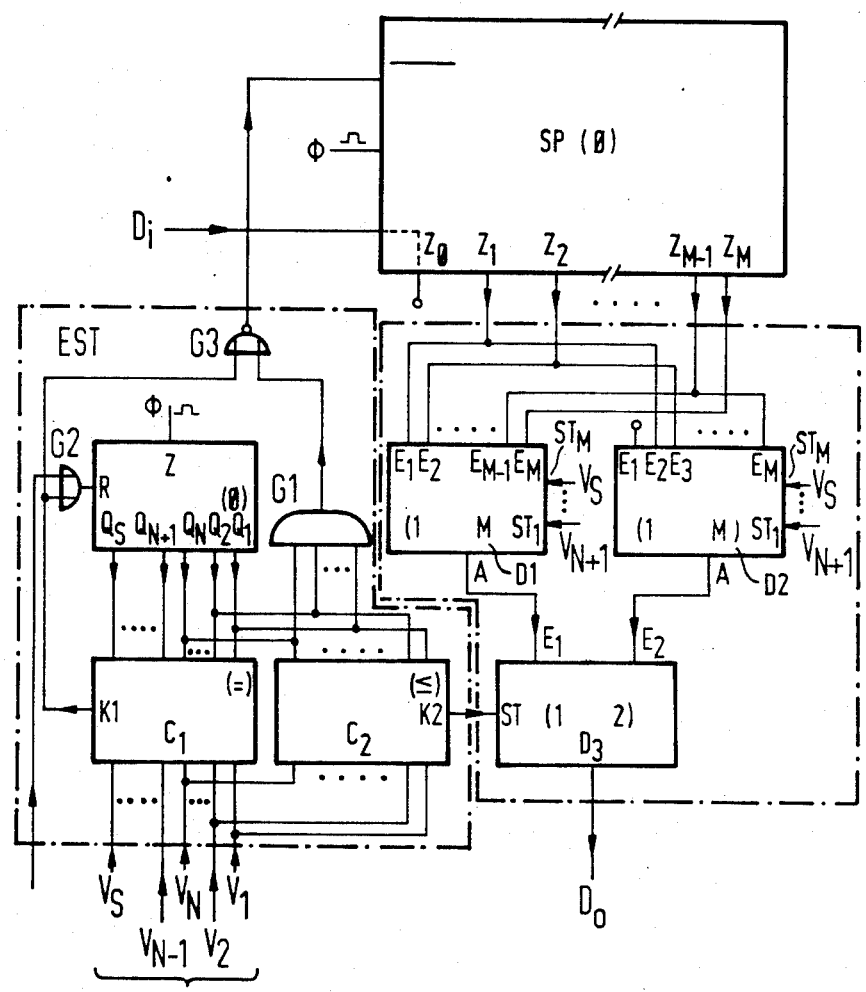
FIG. 3 is a block circuit diagram of a circuit arrangement constructed in accordance with a preferred exemplary embodiment of the invention.

Referring to FIG. 3, a block circuit diagram of a circuit arrangement for practicing the invention is illustrated. This circuit arrangement comprises a matrix-shaped memory, such as in FIG. 1, for variably adjustable delay of digital signals. Trigger circuits in the form of two inverters fed back with one another are provided as storage elements (FIG. 4) of the memory SP, one of the two nodes thereof being connectible to a write bit line bs by way of a switching transistor controllable from a write word line ws and the other being connectible to a read bit line bl via a switching transistor controllable from a read word line wl. A row selector, clock controlled by the input data clock and continuously steppable and resettable at any time is also provided (cf. FIG. 1), this respectively comprising two signal outputs per selection stage offset in phase relative to one another which respectively select one of the write word lines of the read word lines which are provided per row of the matrix. Two separate bit lines, namely one of the write bit lines bs and one of the read bit lines bl are provided per column of the matrix-shaped memory, these being respectively interconnected to all memory cells of the column. A disconnectible storage amplifier $A_1$-$A_m$ is provided per column, which, as mentioned above, has an input i thereof connected to the read bit line bl of the column and the output o thereof connected to the write bit line bs of the column following thereafter and serving as a data output $Z_1$-$Z_m$ assigned thereto. A data input for the data signals to be delayed is connected to the write bit line bs of the first column. A reset input $\overline{Reset}$ is connected to the setting inputs $\bar{s}$ of a first element $P_1$ of the row selector as well as to the reset inputs $\bar{r}$ of the remaining elements $P_2-P_n$ of the row selector. A selection device AUS for selecting columns of the memory SP is provided in addition to the aforementioned structure, the selection device being switchable between two selected, neighboring columns and being supplied with a portion of an external delay time setting data word for selection of these columns. A dynamic switching by way of a supplied control signal ST is provided for switching between the two neighboring columns. A setting and control device EST is provided and is supplied with a full external $\overline{\text{delay}}$ time setting data word, generating a reset signal $\overline{\text{Reset}}$ for the memory SP and a control signal ST for the selection device AUS, and is supplied with an external reset signal $\overline{\text{Reset}}$ via a reset input for directly resetting the setting and control device and indirectly resetting the memory SP. The memory SP comprises a data input $D_i$ by way of which the data to be delayed can be input. The selection device AUS comprises a data output $D_0$ by which the delay data signals can be output. The selection device AUS is connected to the data outputs $Z_1-Z_m$ of the memory arrangement SP via data inputs $E_1-E_m$. The setting and control device EST is a data clock controlled device.

The selection device AUS is composed of an arrangement comprising a first multiplexer $D_1$, a second multiplexer $D_2$ and a third multiplexer $D_3$, whereby the data outputs $Z_1-Z_m$ of the memory SP are respectively connected to data inputs $E_1-E_M$ of the first multiplexer $D_1$ and data inputs $E_2-E_M$ of the second multiplexer $D_2$ with a one-place offset, whereby the last data outputs $Z_M$ of the memory SP is not connected to one of the data inputs of the second multiplexer $D_2$ and the first data input $E_1$ of the second multiplexer $D_2$ remains free. Respective inputs $ST_1-ST_M$ are provided for both multiplexers D1, D2, the selection inputs being charged with the portion of the external delay time setting data word and by way of which the respective output A thereof in the multiplexer D1, D2 is connectible to one of the data inputs, for example $E_2$, in the first multiplexer D1 or $E_2$ in the second multiplexer D2. The two outputs A, A of the multiplexers D1, D2 are connected to the two single data inputs E1, E2 of the third multiplexer D3 whose output A represents the data output $D_o$ for the delayed input data and which comprises a single control input ST.

The setting and control device EST contains a counter Z, a first comparator $C_1$, a second comparator $C_2$, and AND gate G1, and OR gate G2 and a NOR gate G3. The counter Z comprises a plurality of counting stages which corresponds to the plurality of memory locations of the memory SP. The first comparator $C_1$ comprises the function "equals", in contrast whereto the second comparator $C_2$ comprises the function "equal to or less than". The setting and control device EST has a plurality of setting inputs $V_1$, $V_2-V_N$, $V_{N+1}-V_S$ for applying the external delay time setting data word and comprises a reset input Reset, whereby the setting inputs are divided into a first group for the low-order bits of the delay time setting data word comprising the setting inputs $V_1-V_N$ and into a second group for the high-order bits comprising the setting inputs $V_{N+1}-V_S$. An arbitrary row of the memory SP is identified in coded form by way of the setting inputs $V_1-V_N$, this identification serving as a first comparison value for the second comparator $C_2$ and the appertaining row or an arbitrary column are identified in coded form by way of the setting inputs of both the first and the second group, these identifications serving overall as a first comparison value for the first comparator $C_1$. The first comparator $C_1$ has a plurality of comparison value inputs corresponding to the data outputs $Q_1-Q_N$, $Q_{N+1}-Q_S$ of the counter Z to which a counter reading data word corresponding to the respective counter reading of the counter Z is supplied. The second comparator $C_2$ has a plurality of comparison value inputs corresponding to the data outputs $Q_1-Q_N$ of a first group of data outputs of the counter Z to which the low-order bits of the counter reading data word corresponding to the respective counter reading are supplied. These latter bits are likewise supplied to the AND gate G1 by way of a corresponding plurality of inputs. The first comparator $C_1$ has a comparison output K1 which is connected to one of the two inputs of the OR gate G2 and to one of the two inputs of the NOR gate G3 and emits an output signal in accordance with the condition.

$$K_1 = \{Q_1 \ldots Q_S\} = \{V_1 \ldots V_S\}.$$

The second input of the OR gate G2 is connected to the reset input of the setting and control device EST. The second input of the NOR gate G3 is connected to the output of the AND gate G1. The reset input of the memory SP is charged with the output signal of the NOR gate G3. A reset input R of the counter Z is charged with the output signal of the OR gate G2. A comparison output K2 of the second comparator $C_2$ is connected to the control input ST of the third multiplexer D3. The second comparator $C_2$ emits an output signal to the comparison output K2 in accordance with the condition $$K_2 = \{Q_1 \ldots Q_N\} \leq \{V_1 \ldots V_N\}$$

in which case the first data input $E_1$ of the third multiplexer D3 is connected to the data output $D_0$ thereof.

A plurality of matrix-shaped memories (not shown) are to be provided in accordance with the word width of the input data, the write word line and read word lines thereof being connected in parallel and being connected to the row selector provided in common for these matrix-shaped memories.

The reset signal which is supplied to the reset input Reset can, in accordance with an exemplary embodiment of the invention, be initialized with the input signals. Another possible solution, according to the invention, provides that a reset signal is internally generated in the chip comprising the circuit arrangement, being generated by an externally adjustable, cyclical counter.

It is advantageously provided in accordance with the invention that only data outputs are conducted out of the circuit arrangement which are required for the respective purpose of the circuit arrangement.

The amplifiers $A_1-A_m$ are inverting. However, it is also possible to construct the amplifiers $A_1-A_m$ non-inverting and to accordingly arrange a respective inverter at every second data output $Z_1-Z_m$ of the memory arrangement SP.

In accordance with another feature of the invention, the row selector $P_1-P_n$ is composed of a shift register, of a logic block and of two output drivers having the outputs ws and, respectively, wl, per element of the row selector (not shown), whereby the phase relationships and the pulse widths of the output signals at the outputs ws and wl can be effected by corresponding linkages of three taps present in the shift register.

It is advantageously provided that the circuit arrangement of the present invention is realized as a monolithically integrated MOS circuit.

Figure 4:
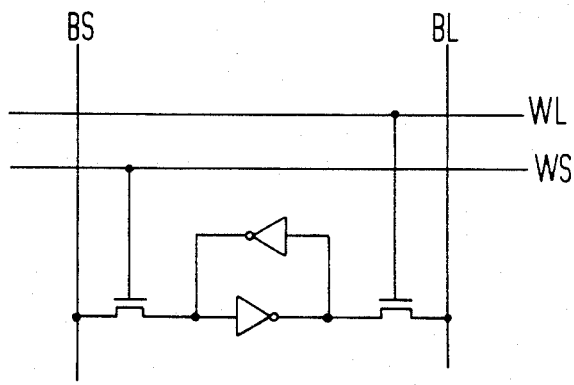
FIG. 4 is a circuit diagram of a circuit employed in practicing the present invention.
Figure 5A:
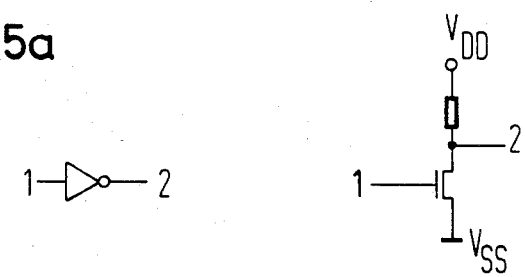
FIGS. 5a, 5b and 5c each illustrate an exemplary embodiment of an inverting amplifier as may be employed in pairs in anti-parallel circuitry in accordance with an exemplary embodiment of the invention of the type shown in FIG. 4.
Figure 5B:
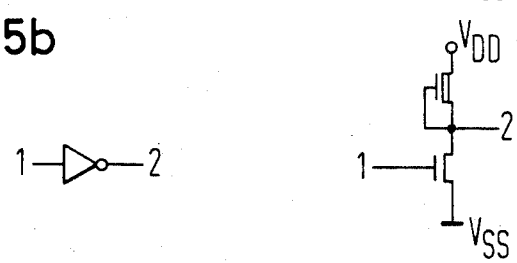
Figure 5C:
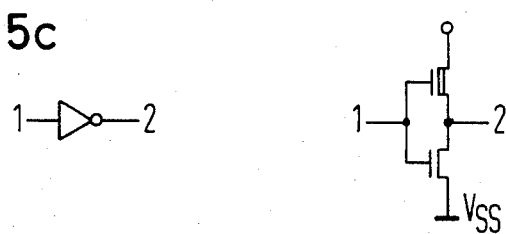

FIGS. 5a, 5b and 5c show, as already set forth at the outset, various embodiments of the inverting amplifiers as provided in pairs in accordance with FIG. 4 as trigger circuits in anti-parallel circuitry.

Figure 6:
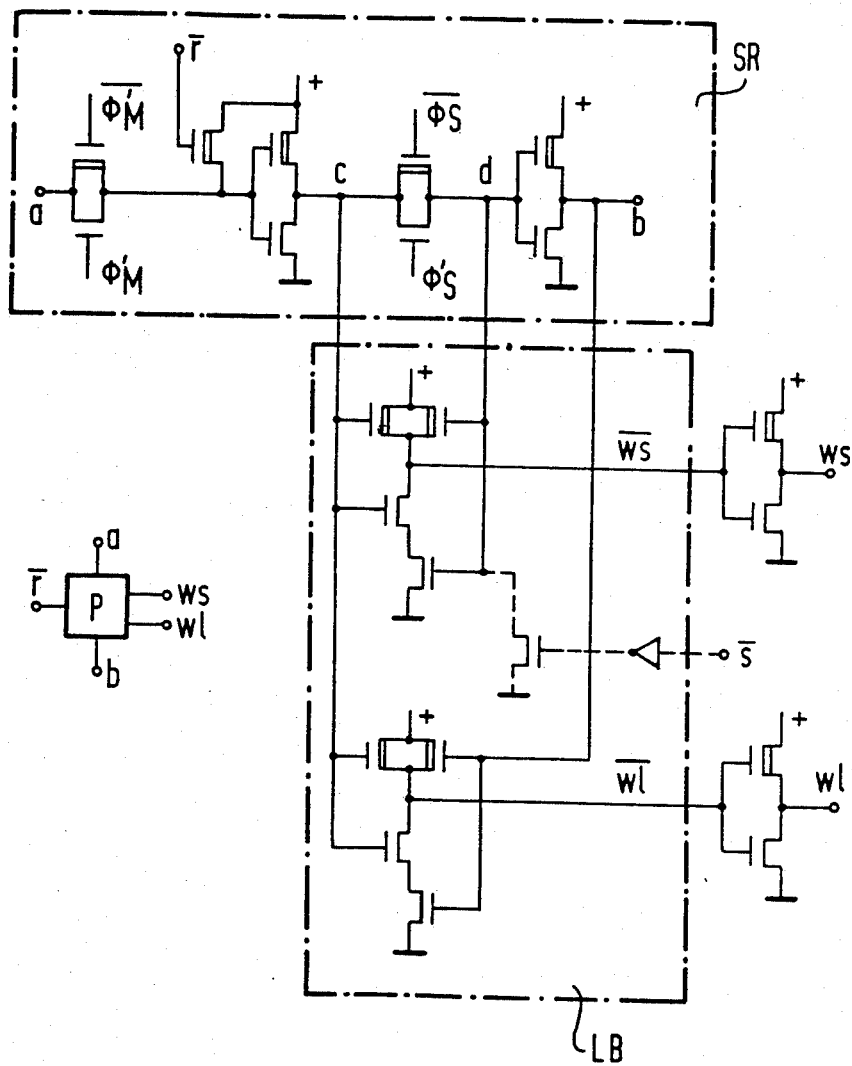
FIG. 6 is a schematic representation of a row selector stage of FIG. 1 and the equivalent circuit diagram thereof, these stages being employed n-fold in the circuit arrangement of FIG. 1.

FIG. 6, as already set forth, shows a construction of a row selector stage P. Two dynamic register stages are provided in a shift register block SR, these being disconnectible from one another or, respectively, from the signal input a by way of switches controlled with the auxiliary clocks $\phi_{M'}$, $\overline{\phi_{M'}}$, $\phi_S$, $\overline{\phi_S}$. The auxiliary clocks $\phi_{M'}$ and $\overline{\phi_{M'}}$ correspond to the auxiliary clocks $\phi_M$ of FIG. 2. However, they represent result signals of a combination of the appertaining signals illustrated in FIG. 2 with the reset signal. This combination effects a closing of the switch at the input of the shift register block SR for the duration of the reset signal. Two logic elements are provided in a logical block LB, these logic elements combining the signals appearing at the points C, D, B with one another in accordance with the functions:

$$\overline{ws} = \overline{c \wedge d}$$

$$\overline{wl} = \overline{c \wedge b}$$

The output signal $\overline{ws}$ and $\overline{wl}$ of the logic block LB are switched onto the write word line ws or, repectively, the read word line wl of the appertaining row of the matrix-shaped memory by way of inverting drivers. A respective reset input $\overline{r}$ is provided for the stages $P_2$–$P_n$ of the row selector of FIG. 1. At the stage $P_1$, this is replaced by a setting input $\overline{s}$ as indicated with broken lines in FIG. 6.

Figure 7:
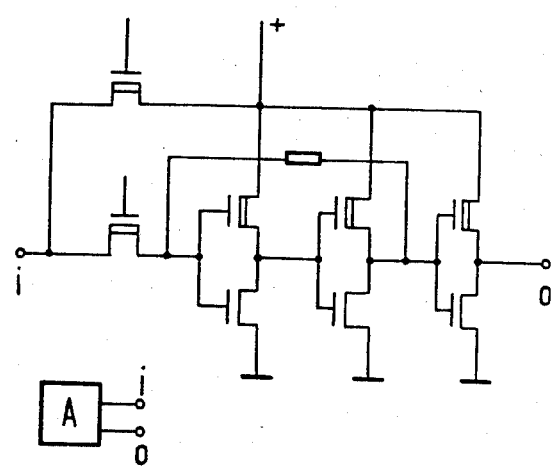
FIG. 7 is a schematic representation of a regenerator or amplifier circuit and an equivalent circuit diagram as may be employed m-fold in the circuit arrangement of FIG. 1.

As already explained, FIG. 7 illustrates an amplifier or regenerator. The purpose of the amplifier is to amplify the attenuated read signal appearing on the read bit line bl connected to the input i to the standard level and to output this signal onto the capacitively heavily loaded write bit line bs connected to the output o. The circuit of this amplifier comprises a three-stage inverter arrangement having a positive feedback path. The inverter arrangement is preceded by a switch which separates the inverter from the input i whenever the read bit line is preloaded for the next clock cycle, controlled by a hold signal, thereby holding the stored information. The precharging is thereby effected by a further switch controlled by a precharge signal.

Although I have described my invention by reference to a particular illustrative embodiment thereof many changes and modifications of the invention may become apparent to those skilled in the art without departing from the spirit and scope thereof. I therefore intend to include within the patent warranted hereon all such changes and modifications as may reasonably and properly be included within the scope of my contribution to the art.

I claim:

1. A circuit arrangement comprising:
   a matrix-shaped memory for variably adjustable delay of data signals, said memory including a plurality of memory cells arranged in columns and rows,
   each of said memory cells comprising a pair of inverters each including an input and an output with the input of each inverter connected to the output of the other inverter and defining a pair of junctions, and a pair of switching transistors each including a control electrode and a controlled-conduction path connected to a respective junction,
   a write word line and a read word line per row of said matrix-shaped memory, and
   a write bit line and a read bit line per column of said matrix-shaped memory;
   said write word line and said read word line of each respective row connected to respective control electrodes of said switching transistors of all memory cells of that row;
   said write bit line and said read bit line of each of said columns connected to the controlled-conduction paths of respective transistors opposite respective junctions of each memory cell of that column;
   an input data clocked row selector comprising a pluralilty of serially connected stages, said row selector being continuously steppable and arbitrarily resettable at any time, said row selector comprising two signal outputs per stage which are offset in phase relative to one another and respectively connected to and for selecting the write word line and a read word line of a respective row of memory cells, each of said stages of said row selector including a reset input connected to a common reset input for receiving a row selector reset signal, the first stage of this series further including a set input connected to said common reset input for receiving a row selector input signal to set the row selector to the respective row of memory cells;
   a plurality of disconnectible storage amplifiers, each of said amplifiers including an input connected to the read bit line of the respective column and an output connected to the write bit line of the adjacent column and further serving as a delayed data output;
   a data input for receiving data signals to be delayed connected to the write bit line of a first column and also serving as an undelayed data output;
   a column selector for selecting columns of said matrix-shaped memory, said column selector comprising a plurality of data inputs connected to the undelayed data outputs, a delay setting input for receiving a portion of a delay time setting word defining a selection of a column, a control signal input for receiving a control signal, and switching means operable in response to said control signal to select the column corresponding to the time delay defined by said portion of the delay time setting word; and
   a data clock control means including an input for receiving the complete delay time setting word, an input for receiving an external reset signal, a control signal output connected to said control signal input of said column selector, a reset output connected to said common reset input of said row selector, and means responsive to said external reset signal and to said delay time setting word to reset said control means and said row selector.

2. The circuit arrangement of claim 1, wherein:
   said row selector comprises a multi-stage shift register, each of said stages including a logic block and a pair of output drivers, and wherein each of said shift register stages comprises three taps connected to said logic block and effecting the phase relationships and pulse widths of the output signals to said write word line and said read word line of a respective row.

3. The circuit arrangement of claim 1, for increased data length, and further comprising:
a plurality of said matrices with their write and read word lines connected respectively in parallel and in common to said row selector; and
a corresponding plurality of said column selectors connected to respective ones of said matrices and connected to and controlled by said control means.

4. The circuit arrangement of claim 1, wherein:
said column selector comprises first, second and third multiplexers each including a plurality of inputs and an output said third multiplexer further including said control signal input, said inputs of said first multiplexer connected to said delayed outputs of said matrix-shaped memory, said inputs of said second multiplexer connected to said delayed outputs of said matrix-shaped memory offset by one place such that the most delayed data output is only connected to said first multiplexer and the first input of said second multiplexer remains free of connection, said outputs of said first and second multiplexers connected to said inputs of said third multiplexer and said output of said third multiplexer serving as a data ouput for said matrix-shaped memory;
said first and second multiplexers each including a plurality of inputs constituting said delay setting input for establishing a data path through said first and second multiplexers to said third multiplexer;
said delay time setting data word divided into a plurality of low-order bits and a plurality of high-order bits;
said control means comprises a clocked counter including a reset input and a plurality of stages equal in number to the number of memory locations and each including an output, first and second comparators each including a plurality of inputs connected to at least some of said outputs of said counter and each including a plurality of setting inputs constituting said setting input for receiving said complete delay time setting word, said first comparator operable to compare said counter output to said complete time delay data word on an "equal to" basis and said second comparator operable to compare said counter output with a plurality of low-order bits of said time setting data word on an "equal to or less than" basis, said first comparator including an output and operable to produce a reset signal at said output and said second comparator including an output connected to said third multiplexer control signal input and operable to provide said control signal;
said first and second comparators operable to produce respective output signals K1 and K2 in accordance with the relationships $$K1 = \{Q_1 \ldots Q_S\} = \{V_1 \ldots V_S\}$$

$$K2 = \{Q_1 \ldots Q_N\} \leqq \{V_1 \ldots V_N\}.$$

where $Q_1 \ldots Q_N$ is the low order and $Q_{N+1} \ldots Q_S$ is the high order of the counter output sequence and $V_1 \ldots V_N$ are the low-order bits and $V_{N+1} \ldots V_S$ are the high-order bits of the delay time setting data word,
where K1 establishes internal reset and K2 causes said third multiplexer to select said output of said first multiplexer;
an external reset signal input;
an AND gate including a plurality of inputs connected to said counter outputs, and an output;
an OR gate including a first input connected to said output of said first comparator, a second input connected to said external reset signal, and an output connected to said reset input of said counter; and
a NOR gate including a first input connected to said output of said first comparator, a second input connected to said output of said AND gate, and an output connected to said common reset input of said matrix-shaped memory.

5. The circuit arrangement of claim 4, and further comprising:
an externally settable, cyclical counter for generating a reset signal.

6. The circuit arrangement of claim 4, wherein:
each of said amplifiers is an inverting amplifier.

7. The circuit arrangement of claim 4, wherein:
each of said amplifiers is a non-inverting amplifier; and
a respective inverter is connected between said output of every second one of said amplifiers.

8. The circuit arrangement of claim 4, wherein:
said matrix-shaped memory, said column selector, said row selector and said control means are comprised on a single monolithically integrated metal-oxide-semiconductor circuit.

* * * * *